United States Patent
MacQuarrie et al.

[19]
[11] Patent Number: 6,150,716
[45] Date of Patent: *Nov. 21, 2000

[54] METAL SUBSTRATE HAVING AN IC CHIP AND CARRIER MOUNTING

[75] Inventors: Stephen Wesley MacQuarrie, Vestal, N.Y.; Wayne Russell Storr, New Milford, Pa.; James Warren Wilson, Vestal, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/783,775

[22] Filed: Jan. 15, 1997

Related U.S. Application Data

[63] Continuation-in-part of application No. 08/378,347, Jan. 25, 1995, Pat. No. 5,616,958.

[51] Int. Cl.[7] .................................................. H01L 23/34
[52] U.S. Cl. ...................... 257/709; 257/778; 257/706; 257/708; 257/712; 257/762; 257/766; 257/696
[58] Field of Search ................................... 257/778, 706, 257/708, 712, 762, 766, 709, 699, 696, 717

[56] References Cited

U.S. PATENT DOCUMENTS

| | | | |
|---|---|---|---|
| 3,781,596 | 12/1973 | Galli et al. ............................... | 361/751 |
| 3,981,691 | 9/1976 | Cuneo ...................................... | 428/626 |
| 4,092,697 | 5/1978 | Spaight ................................ | 257/706 X |
| 4,711,804 | 12/1987 | Burgess .................................... | 428/210 |
| 4,882,454 | 11/1989 | Peterson et al. ......................... | 174/252 |
| 5,038,132 | 8/1991 | Lindblom et al. ....................... | 338/307 |
| 5,044,074 | 9/1991 | Hadwiger et al. ......................... | 29/848 |
| 5,168,926 | 12/1992 | Watson et al. ....................... | 257/706 X |
| 5,173,844 | 12/1992 | Adachi et al. ........................... | 361/792 |
| 5,194,933 | 3/1993 | Miyagi ..................................... | 257/753 |
| 5,320,919 | 6/1994 | Azuma et al. ........................... | 428/546 |
| 5,390,082 | 2/1995 | Chase et al. ............................. | 361/783 |
| 5,583,378 | 12/1996 | Marrs et al. ............................. | 257/710 |
| 5,610,442 | 3/1997 | Schneider et al. ....................... | 257/778 |
| 5,616,958 | 4/1997 | Laine et al. .............................. | 257/778 |
| 5,629,835 | 5/1997 | Mahulikar et al. ...................... | 257/709 |
| 5,635,762 | 6/1997 | Gamand .................................. | 257/778 |

FOREIGN PATENT DOCUMENTS 2131935  5/1990  Japan .

OTHER PUBLICATIONS

Anonymous, "Cable Attached Surface Mount Package," Research Disclosure, Oct. 1989, No. 306 (30680).
"Connected Ground and Floating Plane Package Design and Electrical Analysis," M.K. Kerr, S.P. Moore and W.F. Lawson, 44th Electronic Components and Technology Conference, May, 1994, pp. 971–977.
U.S. Statutory Invention Registration No. H498—Published Jul. 5, 1988. Keller et al.

*Primary Examiner*—John Guay
*Attorney, Agent, or Firm*—James A. Lucas; Driggs, Lucas, Brubaker & Hogg Co., L.P.A.

[57] ABSTRACT

A package for mounting an integrated circuit chip to a circuit board or the like is provided. The package includes a chip carrier which has a metal substrate including first and second opposed faces. A dielectric coating is provided on at least one of the faces, which preferably is less than about 20 microns in thickness, and preferably has a dielectric constant from about 3.5 to about 4.0. Electrical circuitry is disposed on the dielectric coating, said circuitry including chip mounting pads, connection pads and circuit traces connecting the chip mounting pads to the connection pads. An IC chip is mounted by flip chip or wire bonding or adhesive connection on the face of the metal substrate which has the dielectric coating thereon. In any case, the IC chip is electrically connected to the chip mounting pads either by the solder ball or wire bond connections. Electrical leads extend from the connection pads on the chip carrier and are connected to corresponding pads on a circuit board or the like to provide I/O signals for the IC chip. In certain embodiments, additional heat sinks can be attached to the chip carrier and, also in certain embodiments, chips can be mounted on both sides of the chip carrier to increase the capacity of the chip carrier.

17 Claims, 4 Drawing Sheets

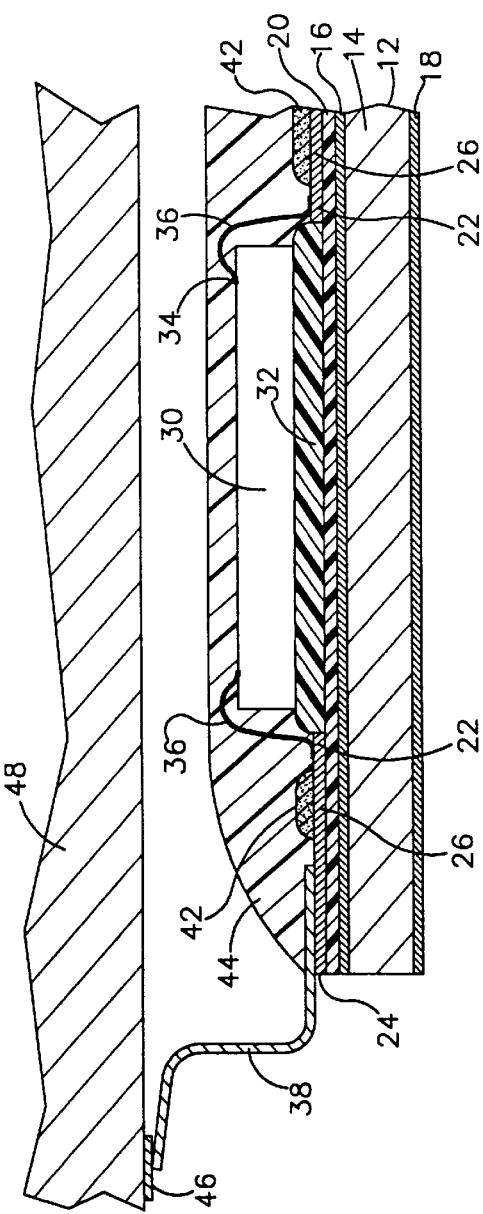
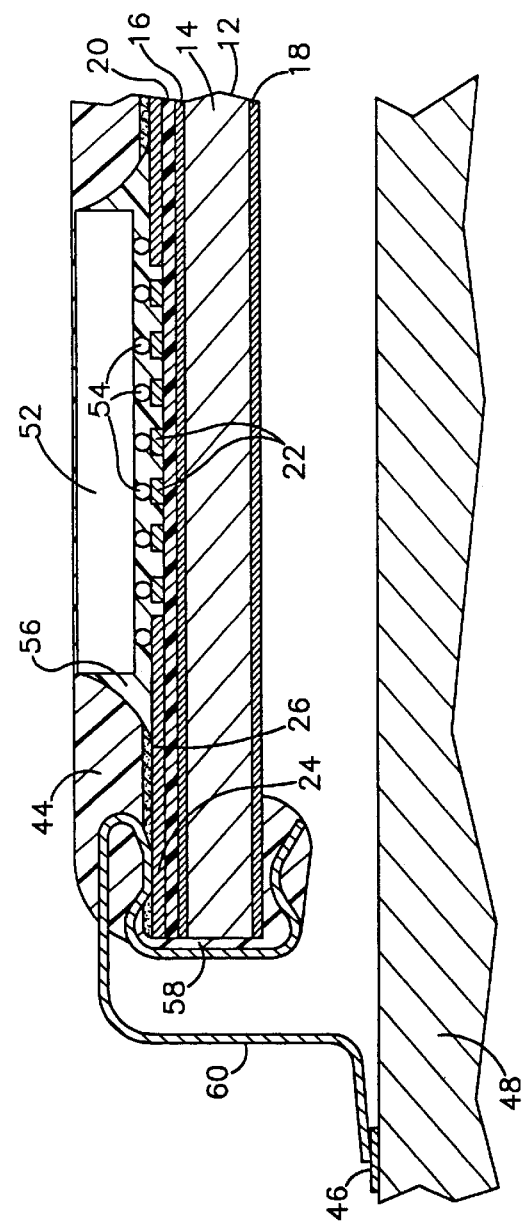

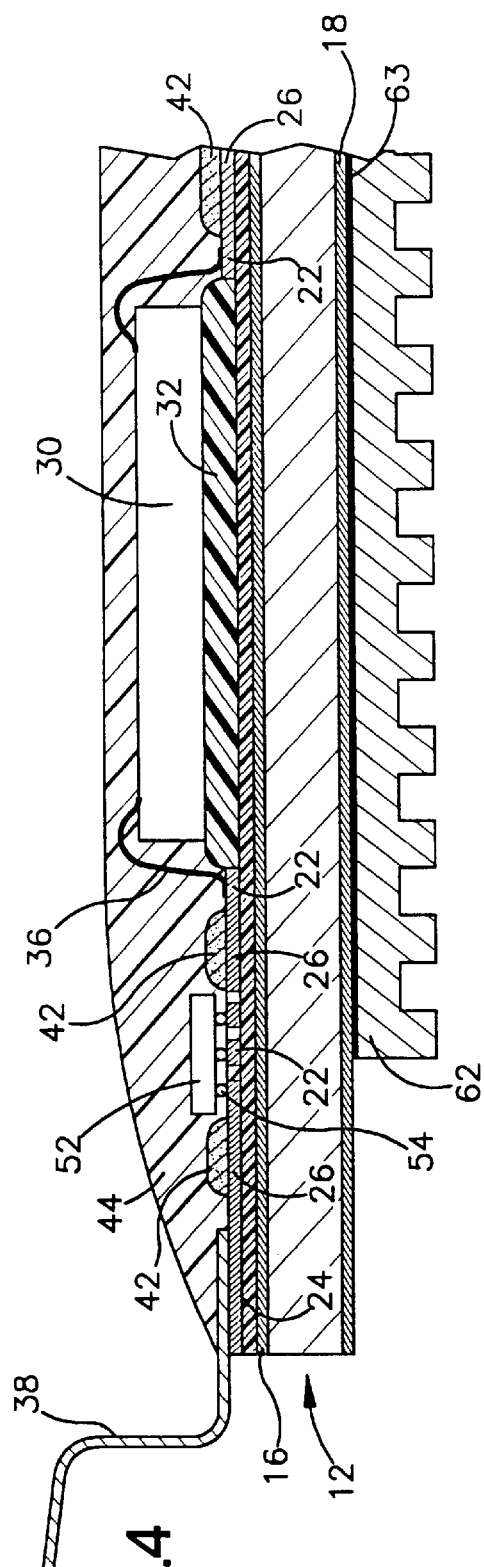
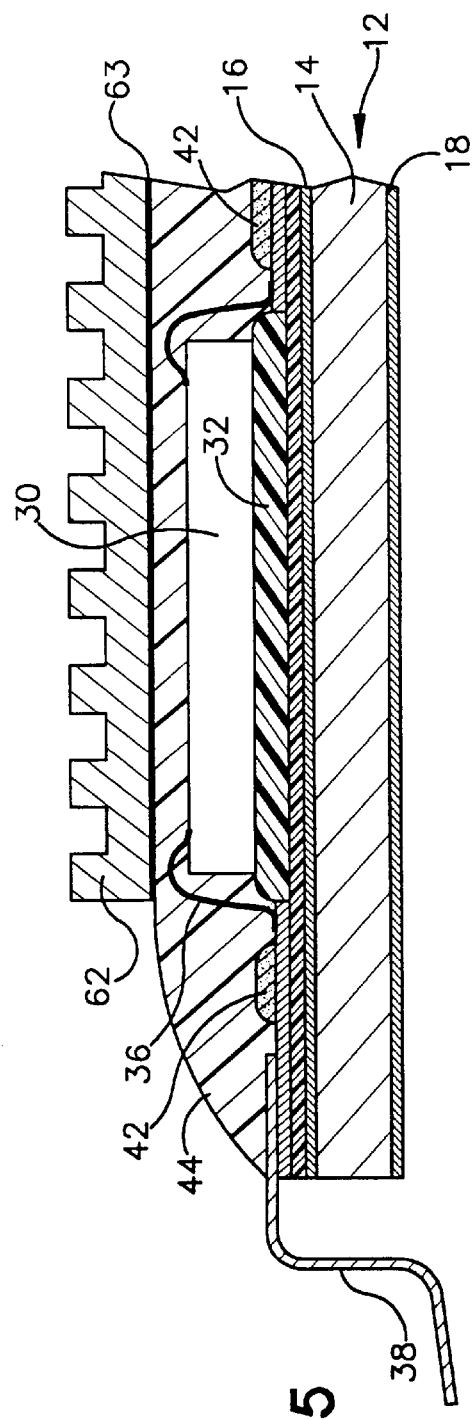

METAL SUBSTRATE HAVING AN IC CHIP AND CARRIER MOUNTING

RELATED APPLICATIONS

This application is a continuation-in-part of application Ser. No. 08/378,347, filed Jan. 25, 1995, entitled "Electronic Package" now U.S. Pat. No. 5,616,958.

FIELD OF THE INVENTION

This invention relates generally to packaging of integrated circuit (IC) chips on chip carriers for mounting on circuit boards and the like, and more particularly to a technique for providing chip and carrier mountings for so-called flat pack outline.

BACKGROUND OF THE INVENTION

A conventional carrier for chip mounting which has been used for many years is a metalized ceramic flat pack construction. While the ceramic has many good features, there are certain drawbacks to its use. For example, the ceramic does not have particularly good thermal conductivity properties, and thus often require innovative techniques for removal of heat. Also, the ceramic requires careful handling, especially before firing to prevent breakage. Moreover, ceramic requires several operations to form the necessary ceramic carrier, thus resulting in a fairly high cost.

There has been some effort to replace ceramic carriers with an organic carrier, such as glass-filled epoxy, which has characteristics similar to that of a circuit board, i.e., the same material. While certain of the drawbacks of the ceramic carrier are overcome, nevertheless such carriers have certain drawbacks, such as relatively poor conductivity and certain technological problems in forming the required fine line circuitry on the surface of the carrier for the connecting of the chip thereon and conveying the signals to and from the circuit board.

It is therefore a principal object of the present invention to provide a package for mounting an integrated circuit chip to a circuit board which includes a chip carrier having improved heat transfer properties and good electrical properties, including a floating ground plane.

SUMMARY OF THE INVENTION

According to the present invention, a package for mounting an integrated circuit chip to a circuit board or the like is provided. The package includes a chip carrier which has a metal substrate including first and second opposed faces. Preferably, the metal substrate is formed of a copper material with chromium plated on one or both sides thereof. A dielectric coating is provided on at least one of the faces, which dielectric coating preferably is polyimide. The dielectric coating preferably is less than about 20 microns in thickness, and preferably has a dielectric constant from about 3.5 to about 4.0. Electrical circuitry is disposed on the dielectric coating, said circuitry including chip mounting pads, connection pads and circuit traces connecting the chip mounting pads to the connection pads.

An IC chip is mounted on the face of the metal substrate which has the dielectric coating thereon. This mounting can be either by flip chip bonding utilizing solder for mechanical and electrical interconnection, or the mounting can be by adhesively mounting the chip to the board and using wire bond electrical connections. In either case, the IC chip is electrically connected to the chip mounting pads either by the solder ball or wire bond connections. Electrical leads extend from the connection pads on the chip carrier and are connected to corresponding pads on a circuit board or the like to provide I/O signals for the IC chip. In certain embodiments, additional heat sinks can be attached to the chip carrier and, also in certain embodiments, chips can be mounted on both sides of the chip carrier to increase the capacity of the chip carrier.

DESCRIPTION OF THE DRAWINGS

FIG. 2 is a longitudinal sectional view of the chip and chip carrier of FIG. 1 showing the package mounted to a circuit board;

FIG. 3 is a longitudinal sectional view of another embodiment of a package according to the present invention mounted to a circuit board;

FIG. 4 is a longitudinal sectional view of another embodiment of the present invention utilizing an additional heat sink;

FIG. 5 is a longitudinal sectional view of another embodiment according to the present invention also utilizing an additional heat sink, but in a different configuration.

DESCRIPTION OF THE PREFERRED EMBODIMENTS

Figure 1:
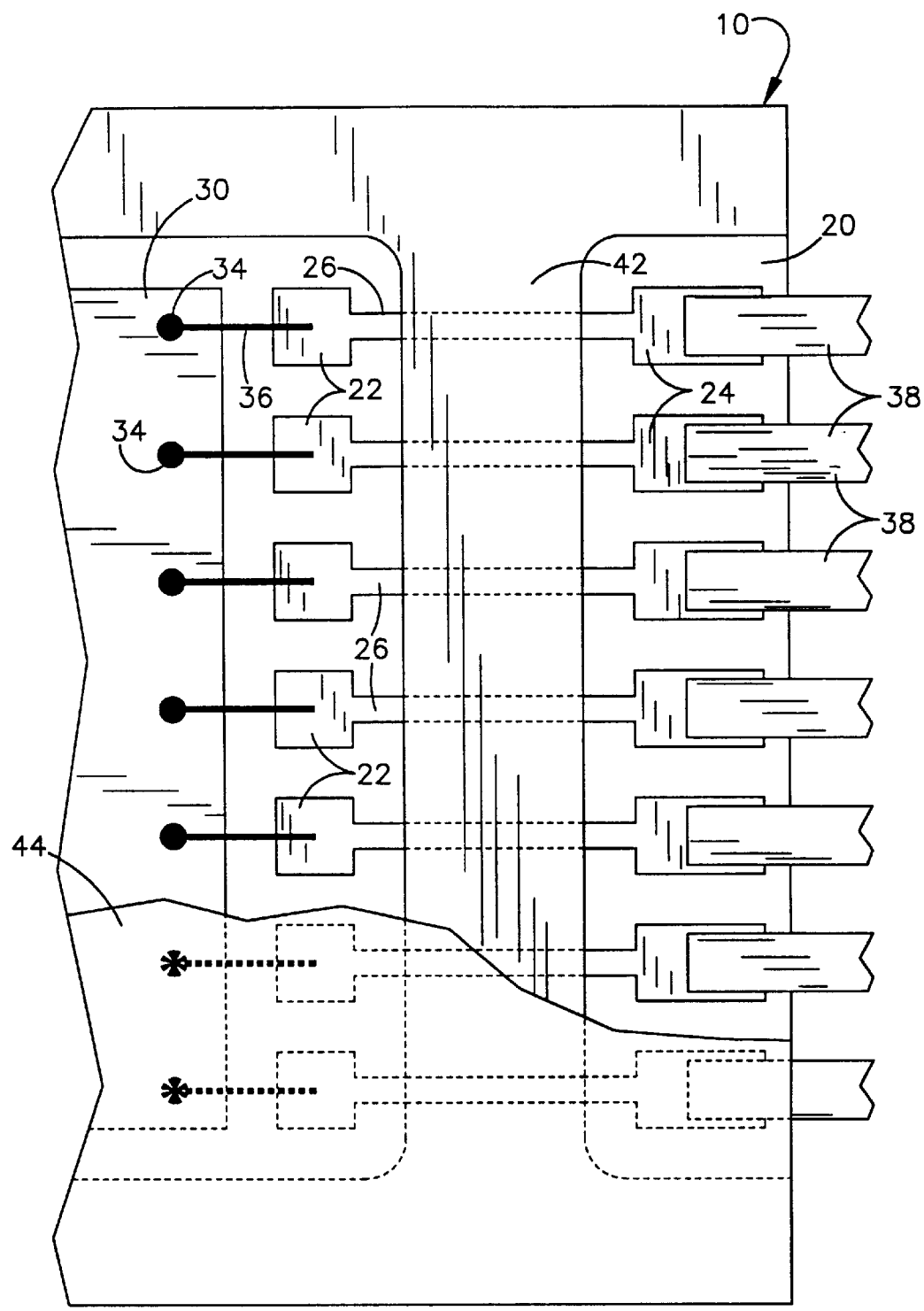
FIG. 1 is a bottom plan view, somewhat schematic with parts broken away for clarity, of a portion of the package of an integrated circuit chip and chip carrier.

Referring now to the drawings, and for the present to FIGS. 1 and 2, one embodiment of an integrated circuit (IC) chip package mounted to a circuit board according to the present invention is shown.

The package includes a chip carrier designated generally as 10, which includes a metal substrate 12. Preferably, the metal substrate is a copper core 14 having chromium 16 and 18 plated on opposite faces thereof. However, as will be described presently, other metals could be used, such as pure copper, invar, copper—invar—copper (C—I—C) and other such materials. However, chromium-plated copper is the preferred material since it is an extremely good electrical conductor and has good heat conducting properties so as to operate as a heat sink. Typically, the substrate 12 is about 0.025 inch thick, although the thickness can range from about 0.010 inch to about 0.040 inch thick. A substrate thinner than 0.010 inch significantly reduces the effectiveness of the substrate as a heat spreader, and a substrate greater than about 0.040 inch makes the package bulky and heavy and does not provide any significant additional heat dissipation.

A thin layer of a dielectric material 20 is applied to one face of the substrate 10 over the chromium 16 thereon, which dielectric preferably has a dielectric constant of between about 3.5 and 4.0. The preferred dielectric is polyimide. The polyimide preferably is applied by spraying which allows for a uniform thin coating to be applied. However, the polyimide can be spin coated. Other dielectrics, such as epoxies, polytetrafluoroethylene, etc., can be used; however, polyimide is preferred because it is easily applied, has uniform coating and can be maintained on the surface without substantial defects down to a thickness of about 6 microns, which is the preferred thickness. However, a thickness up to about 20 microns can be used. The thinner the coating, the better, because the core serves as a floating ground plane, and the thinner the dielectric, the greater the efficiency of the metal substrate 12. Indeed, with a thickness of the polyimide 20 of about 6 microns, the efficiency of the substrate 12 is about 95% of theoretical efficiency, whereas at 20 microns thickness of the polyimide 20, the efficiency falls off to about 50% theoretical. Thus, the thickness of about 20 microns is the desired maximum thickness of the dielectric material 20, whereas a thickness of about 6 microns or less is preferred.

Electrical circuitry is formed on the surface of the dielectric material 20, which electrical circuitry includes chip attachment pads 22, connection pads 24, and circuit traces 26. The circuitry is preferably formed by photoresist technology using sputter deposited metal and subtractive etching techniques as is well known in the art. Typically, the metal is sputter deposited to a thickness of about 6 microns; however, the thickness of the metal can range from about 4 microns to about 8 microns. Metal thinner than about 4 microns can lead to circuit discontinuities, and metal greater than about 8 microns thick inhibits the production of fine circuit features.

An IC chip 30 is provided which is secured to the surface of the substrate 12 by means of conductive epoxy 32. The IC chip 30 has a plurality of I/O contacts 34 which are connected to the chip attach pads 22 by means of wire bond leads 36. The connection pads 24 are provided with electrical leads 38. After forming of the pads 22 and 24 and traces 26, a protective coating 42 is applied which can be polyimide. However, there are many other coatings, such as epoxies, which can be used. The coating can be patterned, screened or, if photosensitive coatings are used, a photolithographic technique can be used to pattern the coating. The protective coating 42 is applied over the circuit traces 26 leaving the chip attachment pads 22 and the connection pads 24 exposed for connection.

The wire bonds 36 are attached to their respective I/O contacts 34 and chip attach pads 22, preferably by thermosonic bonding. The electrical leads 38 are secured to their respective attachment pads 24, preferably by means of solder connections (not shown). Other types of connections, such as conductive epoxy could be used as is well known in the art.

After the IC chip 30 has been secured to the substrate 12 by the epoxy 32 and electrical leads 38 have been attached, the entire surface of the substrate 12 is coated with an epoxy encapsulant 44.

In order to mount the chip and chip carrier package to a circuit board, the electrical leads 38 are attached to contacts 46 or circuit board 48.

The use of the metal substrate 12 provides several advantages over a metalized ceramic substrate. One of these is the relative flexibility of the metal substrate 12, thus reducing the propensity for cracking either as a result of thermal excursions or mechanical handling, as compared to a ceramic carrier, especially in the green state. Another very significant advantage is the excellent heat conducting properties of the metal substrate 12 which allows heat to be quickly dissipated much more efficiently than with a ceramic substrate. Moreover, the metal substrate provides a floating ground plane for the contacts and circuitry which is especially effective with a thin dielectric layer at the 6 micron level.

Also, a factor that must be considered is the significant difference in the coefficient of thermal expansions between the IC chip 30 and the carrier 10 because of the metal substrate 12. An IC chip formed of silicon has a coefficient of thermal expansion (CTE) in the range of about 3–4 ppm/° C., whereas copper has a coefficient of thermal expansion in the range of 18 ppm/° C. In order to reduce the risk of failure due to thermal mismatch, it is necessary to ensure that the chips are very thin, thus increasing their flexibility. Indeed, it is essential that the chips not be any thicker than about 20 mils, and preferably less than 18 mils. With chips thinner than these limits, flexibility is assured with the mounting of the chip using a conductive epoxy which itself is quite flexible. This reduces the propensity for damage due to thermal cycling. Of course, a selection of a different material for the substrate 12, such as copper—invar—copper or invar can reduce the mismatch of the CTE's of the chip 30 and the substrate 12.

FIG. 3 shows another embodiment of the present invention in which flip chip bonding can be utilized to form the package of the carrier and chip. As can be seen in FIG. 3, an IC chip 52 is provided which is mounted to the chip attach pads 22 by means of solder balls 54. As is conventional in this type of flip chip mounting, a reinforcing epoxy 56 is disposed between the chip 52 and the carrier 12 surrounding the solder balls 54. This reinforcing epoxy assists in preventing damage due to thermal mismatch. In this embodiment, insulating material 58 is provide around the end of the substrate 12 and on the opposite surface of the substrate 12 so that lead 60 is electrically insulated from the substrate 12. In this case, leads 60 connect the connection pads 24 to the contacts 46 or the circuit board 48.

If additional heat dissipation is needed, the embodiment shown in FIG. 4 can be utilized, in which an additional heat sink 62 is secured to the opposite side of the substrate 12 from which the chips are attached. The heat sink 62 can be attached by conductive epoxy 63 in a well known manner. Also, FIG. 4 shows how a flip chip 52 can be bonded to the same side of the carrier as a wire bond chip 30.

FIG. 5 shows another embodiment where an additional heat sink 62 is provided, but in this case the heat sink is secured by conductive epoxy 63 to the top of the epoxy 44 encapsulating the chip.

Figure 6:
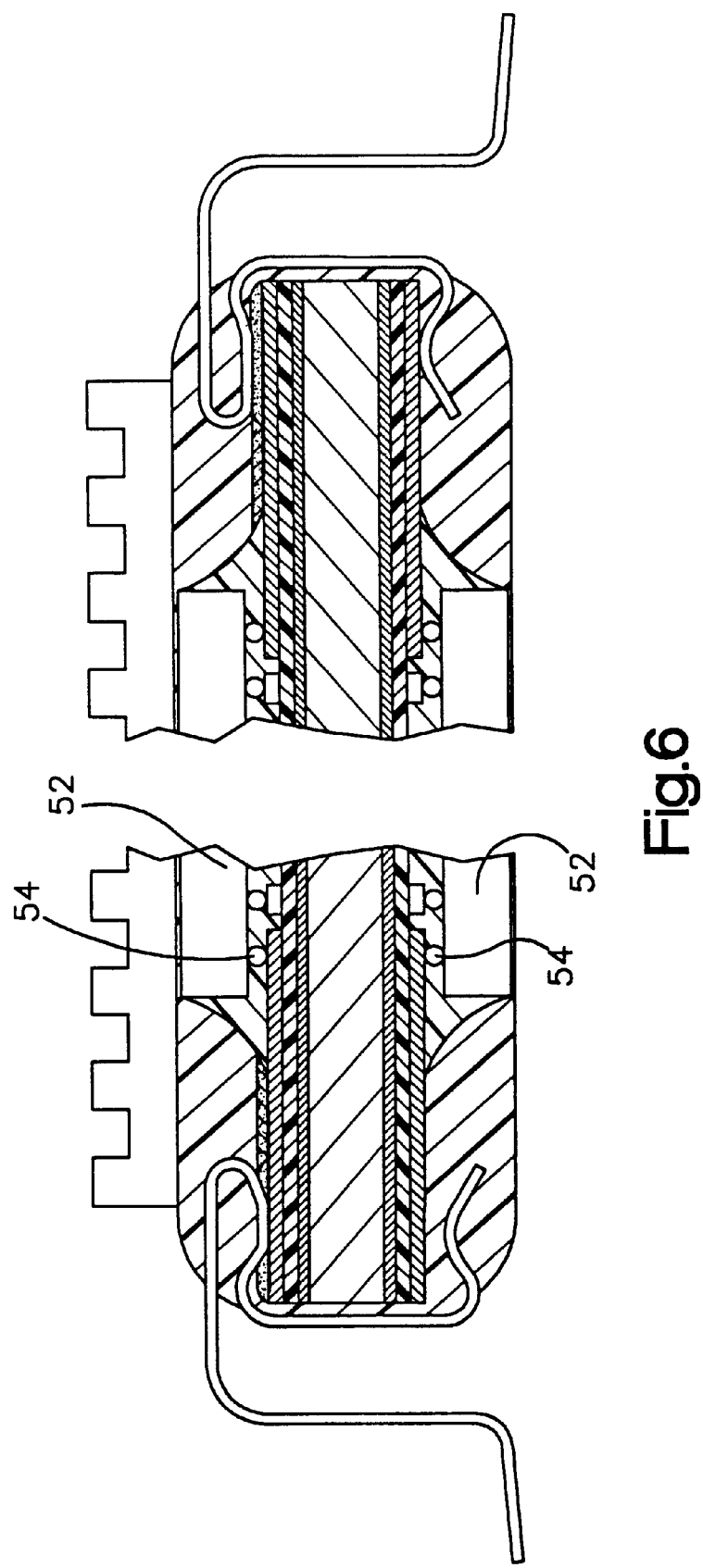
FIG. 6 is a longitudinal sectional view of an embodiment of the present invention utilizing chips on both sides of the carrier and also utilizing an additional heat sink.

FIG. 6 shows an embodiment where chips can be provided on both sides of the chip carrier 10. The embodiment is shown utilizing flip chip technology as shown in FIG. 3 for chips on both sides of the substrate. Of course, wire bond could be used for chips on both sides, or one side could use wire bond technology and the other side flip chip technology. In this case, heat sink 62 optionally is secured to one side, although if space permits, heat sinks could be provided on both sides.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A package comprising an integrated circuit chip and a chip carrier suitable for connection by electrical leads to a circuit board, said package comprising:

a) a metallic substrate having at least one face and composed of a metal selected from the group consisting of pure copper, copper—Invar—copper, copper plated with chromium, and Invar, said substrate having a thickness between about 0.25 millimeters and about 1 millimeters;

b) a dielectric coating on at least one face of the substrate and having a thickness of between about 6 and about 20 microns;

c) electrical circuitry on the dielectric coating including chip mounting pads, connector pads, and circuit traces connecting the chip mounting pads to the connector pads; and d) an integrated circuit chip mechanically connected to and spaced from the dielectric coating by flip chip bonding, or by adhesively mounting and wire bond electrical connectors, said substrate providing a floating ground plane for the electrical circuitry.

2. The package according to claim 1 wherein solder connections are used for flip chip bonding of the integrated circuit chip to the dielectric coating.

3. The package according to claim 2 wherein the substrate is electrically insulated from leads used to electrically join the package to the circuit board.

4. The package according to claim 3 wherein the substrate is electrically insulated using an insulating material between the substrate and the leads.

5. The package according to claim 1 wherein the thickness of the dielectric coating is about 6 microns.

6. The package according to claim 5 wherein the thickness of the metallic substrate is about 0.62 millimeters.

7. The package according to claim 1 wherein the integrated circuit chip is a silicon chip having a thickness of 0.5 millimeters or less.

8. A package for mounting an integrated circuit chip to a circuit board comprising:

a chip carrier comprising a substrate having a copper core, a thickness of between 0.25 millimeters and 1 millimeter, and first and second opposed faces;

an organic dielectric coating disposed directly on at least one of said faces, said dielectric coating being about 6 microns in thickness;

electrical circuitry comprising a layer of metal deposited to a thickness between about 4 microns and about 8 microns on said dielectric coating and subtractively etched to form chip mounting pads, connection pads located around the periphery of said chip carrier, and circuit traces connecting said chip mounting pads to said connection pads;

an integrated circuit chip mounted on said one face of said substrate, said integrated circuit chip having a thickness no greater than about 0.5 millimeters, and I/O contacts;

electrical connections connecting said I/O contacts on said integrated circuit to said chip mounting pads; and electrical leads extending from said connection pads for providing I/O signals to and from said integrated circuit chip, said package being free of any ceramic material.

9. The package according to claim 8 wherein the dielectric material is polyimide.

10. The package according to claim 8 wherein the integrated circuit chip is connected to the chip mounting pads by wire bonds or by flip chip bonding interconnections.

11. The package according to claim 8 wherein the metal substrate includes a layer of copper and wherein the integrated circuit chip is no thicker than about 0.5 millimeters.

12. The package according to claim 8 wherein the dielectric has a dielectric constant of about 3.5 to about 4.0.

13. The package according to claim 8 wherein the thickness of the dielectric layer is no greater than about 6 microns.

14. The package according to claim 8 wherein the metal substrate is chromium-clad copper.

15. The package according to claim 8 wherein a heat sink is attached to said chip carrier.

16. The package according to claim 15 wherein the heat sink is attached to the surface of said substrate which does not have a chip mounted thereon.

17. The package according to claim 8 further characterized by a circuit board attached to said electrical leads.

\* \* \* \* \*